(12) United States Patent
Wasser

(10) Patent No.: US 8,433,554 B2
(45) Date of Patent: *Apr. 30, 2013

(54) PREDICTING SYSTEM PERFORMANCE AND CAPACITY USING SOFTWARE MODULE PERFORMANCE STATISTICS

(75) Inventor: Barry Wasser, Potomac, MD (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/369,734

(22) Filed: Feb. 9, 2012

(65) Prior Publication Data

US 2012/0136644 A1    May 31, 2012

Related U.S. Application Data

(63) Continuation of application No. 12/025,811, filed on Feb. 5, 2008, now Pat. No. 8,140,319.

(51) Int. Cl.
*G06F 9/45* (2006.01)
(52) U.S. Cl.
USPC .................. 703/22; 703/13; 703/21; 702/186
(58) Field of Classification Search .................. 703/13, 703/21, 22; 702/186; 707/2, 102, 202; 709/201, 709/203; 710/306; 713/1; 714/42, 47; 718/100, 718/102; 370/42
See application file for complete search history.

(56) References Cited

U.S. PATENT DOCUMENTS

| | | | |
|---|---|---|---|
| 5,881,268 A * | 3/1999 | McDonald et al. ............. 703/21 |
| 6,041,332 A | 3/2000 | Miller et al. | |
| 6,681,323 B1 * | 1/2004 | Fontanesi et al. ................. 713/1 |
| 6,996,811 B2 | 2/2006 | Nishioka et al. | |
| 7,039,898 B2 | 5/2006 | Shah | |
| 2003/0023653 A1 | 1/2003 | Dunlop et al. | |
| 2004/0148152 A1 * | 7/2004 | Horikawa ........................ 703/22 |
| 2004/0205730 A1 | 10/2004 | Week | |
| 2004/0220792 A1 * | 11/2004 | Gallanis et al. ................. 703/13 |
| 2005/0119905 A1 | 6/2005 | Wong et al. | |
| 2005/0122987 A1 * | 6/2005 | Ignatowski et al. ........... 370/412 |

(Continued)

OTHER PUBLICATIONS

Krishna, et al., Model-Driven Techniques for Evaluating the QoS of Middleware Configurations for DRE Systems, IEEE Computer Society, Proceedings of the 11th IEEE Real Time and Embedded Technology and Applications Symposium (RTAS '05), 10 pages.

(Continued)

*Primary Examiner* — Kandasamy Thangavelu
(74) *Attorney, Agent, or Firm* — Schmeiser, Olsen & Watts; William Schiesser

(57) ABSTRACT

An approach for predicting performance and capacity of an information technology (IT) system before the IT system is built is described, where the predicting uses a database of performance statistics measured for reusable software modules. A performance simulation modeling tool receives a set of performance statistics of a test computer. The set of performance statistics is associated with a set of software modules included in a library of reusable software modules. The set of software modules is required to build a target IT system. The set of performance statistics is received from a database of performance statistics resulting from individual executions on the test computer of each reusable software module in the library. The performance simulation modeling tool predicts computing resources required by the target IT system. The computing resources prediction follows the receipt of the set of performance statistics and precedes the target IT system being built.

17 Claims, 6 Drawing Sheets

U.S. PATENT DOCUMENTS

| | | | |
|---|---|---|---|
| 2006/0059458 A1 | 3/2006 | Plummer | |
| 2006/0074970 A1* | 4/2006 | Narayanan et al. | 707/102 |
| 2006/0095967 A1 | 5/2006 | Durham et al. | |
| 2006/0218128 A1 | 9/2006 | Muras | |
| 2006/0218450 A1* | 9/2006 | Malik et al. | 714/47 |
| 2006/0288149 A1* | 12/2006 | LaVigne et al. | 710/306 |
| 2007/0005330 A9* | 1/2007 | Hardwick et al. | 703/22 |
| 2007/0219944 A1* | 9/2007 | Liu et al. | 707/2 |
| 2008/0065702 A1* | 3/2008 | Dickerson et al. | 707/202 |
| 2008/0115014 A1* | 5/2008 | Vaidyanathan et al. | 714/42 |
| 2008/0208536 A1* | 8/2008 | Bondi | 702/186 |
| 2008/0262822 A1* | 10/2008 | Hardwick et al. | 703/21 |
| 2008/0270526 A1* | 10/2008 | Barnett et al. | 709/203 |
| 2008/0271025 A1* | 10/2008 | Gross et al. | 718/102 |
| 2009/0055823 A1* | 2/2009 | Zink et al. | 718/100 |
| 2009/0150472 A1* | 6/2009 | Devarakonda et al. | 709/201 |
| 2009/0198473 A1 | 8/2009 | Wasser | |

OTHER PUBLICATIONS

Wang et al; Extract Rules from Software Quality Prediction Model Based on Neural Network, IEEE Computer Society, Proceedings of the 16th IEEE International Conference on Tools with Artificial Intelligence (ICTAI 2004), 3 pages.

Chien, et al., Automated software module reconfiguration through the use of artificial intelligence planning techniques, IEE Proc.-Softw. vol. 147, No. 5, Oct. 2000; pp. 186-192.

Office Action (Mail Date Jun. 29, 2010) for U.S. Appl. No. 12/025,811, filed Feb. 5, 2008.

Amendment filed Oct. 6, 2010 in response to Office Action (Mail Date Jun. 29, 2010) for U.S. Appl. No. 12/025,811, filed Feb. 5, 2008.

Office Action (Mail Date Dec. 14, 2010) for U.S. Appl. No. 12/025,811, filed Feb. 5, 2008.

Amendment filed Mar. 14, 2011 in response to Office Action (Mail Date Dec. 14, 2010) for U.S. Appl. No. 12/025,811, filed Feb. 5, 2008.

Office Action (Mail Date May 17, 2011) for U.S. Appl. No. 12/025,811, filed Feb. 5, 2008.

Amendment filed Sep. 19, 2011 in response to Office Action (Mail Date May 17, 2011) for U.S. Appl. No. 12/025,811, filed Feb. 5, 2008.

Notice of Allowance (Mail Date Nov. 23, 2011) for U.S. Appl. No. 12/025,811, filed Feb. 5, 2008.

* cited by examiner

PREDICTING SYSTEM PERFORMANCE AND CAPACITY USING SOFTWARE MODULE PERFORMANCE STATISTICS

This application is a continuation application claiming priority to Ser. No. 12/025,811, filed Feb. 5, 2008.

FIELD OF THE INVENTION

The present invention relates to a method and system for predicting system performance and capacity, and more particularly to a technique for generating a set of performance statistics associated with a library of reusable software modules and utilizing a performance simulation modeling tool to accurately predict system performance and capacity prior to the system being built.

BACKGROUND OF THE INVENTION

Building an information technology (IT) system requires developing a system architecture that meets specified functional and non-functional requirements. With respect to meeting non-functional requirements, known IT system building techniques are costly, lead to excessively long development cycles, and are marked by performance and stability problems. Conventional risk mitigation strategies for non-functional requirements validation during the development cycle of an IT system are listed below:

Building and testing the IT system before deployment. This approach is the most accurate, but is also excessively expensive because all of the hardware and software must be acquired and the system must be built prior to an assessment of the non-functional requirements.

Testing in a test environment. This strategy is very costly and time-consuming if a production-like test environment is built. If shortcuts are used to build the test environment, such as building less than a full end-to-end system, using stubbed out interfaces, using emulators or simulators, reducing the test scope, etc., then the risk mitigation and the accuracy of the validation is negatively impacted.

Building and testing prototypes. This approach is also expensive and requires at least some of the hardware that the target system is supposed to use. Very often, prototype testing emphasizes functional requirements testing at the expense of non-functional requirements testing.

Capacity and performance simulation modeling. This approach requires having performance data for the system available in order to calibrate the model. Therefore, using this approach requires either having the system available to test or having a test or prototype system available to generate system performance statistics. If actual or test data is unavailable, then the accuracy of the modeling results decreases. In cases in which the modeling approach is used iteratively as more system performance statistics become available, this approach becomes time-consuming. This approach may also require acquiring new hardware before the system performance is validated. Often final results are not available by the time the hardware for the new system must be purchased. Finally, initial estimates may be deficient because of inaccuracies.

Paper and pencil estimation. Although being the fastest and cheapest of the listed conventional methods of estimating predicted performance or required capacity of a system, this approach is the least accurate method and suffers from a number of other drawbacks. This approach is less useful if the system being built is complex because the more complex the system, the more difficult it becomes to keep track of all system components.

Thus, there exists a need to overcome at least one of the preceding deficiencies and limitations of the related art.

SUMMARY OF THE INVENTION

The present invention provides a computer-implemented method of predicting system performance and capacity using a database of performance statistics measured for reusable software modules, comprising:

receiving, by a performance simulation modeling tool of a computing system, a set of performance statistics of a test computer, wherein the set of performance statistics is associated with a set of reusable software modules included in a library of reusable software modules, wherein the set of reusable software modules is required for building a target information technology (IT) system, and wherein the set of performance statistics is received from a database of a plurality of performance statistics resulting from a plurality of individual executions on the test computer of each reusable software module of the library; and predicting, by the performance simulation modeling tool, subsequent to the receiving the set of performance statistics and prior to the target IT system being built, a plurality of computing resources required by the target IT system.

A system, computer program product and a process for supporting computing infrastructure that provides at least one support service corresponding to the above-summarized method are also described and claimed herein.

Advantageously, the present invention provides an IT system performance and capacity prediction technique that provides inexpensive, accurate and quick predictions of computing resources required for a target IT system prior to the acquisition of any computing hardware for building the target IT system.

DETAILED DESCRIPTION OF THE INVENTION

Overview

The present invention generates a set of component-level performance statistics (a.k.a. performance characteristics) associated with a library of reusable software modules (a.k.a. software components) and stores these performance statistics in a database in permanent storage. The component-level performance statistics in the database are used to estimate full (i.e., overall) performance characteristics of complex IT systems before the IT systems are built. The software modules in the library are reusable as building blocks of the IT systems.

Performance & Capacity Prediction System

Figure 1:
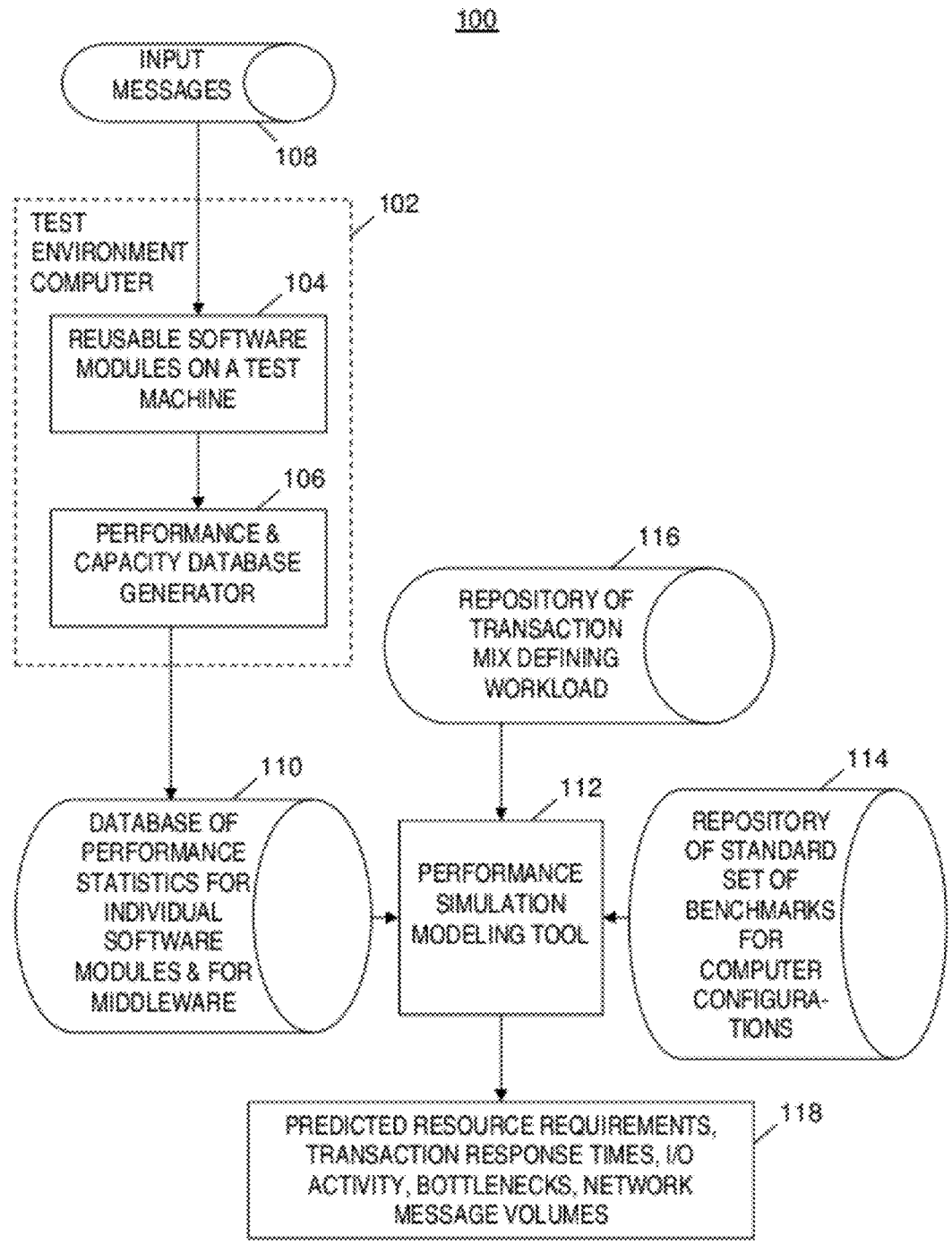
FIG. 1 is a block diagram of a system for predicting system performance and capacity using a database of performance statistics measured for reusable software modules, in accordance with embodiments of the present invention.

FIG. 1 is a block diagram of a system for predicting system performance and capacity using a database of performance statistics measured for reusable software modules, in accordance with embodiments of the present invention. System 100 includes a test environment computer 102 (a.k.a. test computer) that includes reusable software modules 104 that can be executed on test computer 102 and a performance & capacity database generator 106. In one embodiment, test environment computer 102 is one of multiple computers which comprise a test bed for generating performance statistics for each of the software modules 104. The functionality of performance & capacity database generator 106 is discussed below relative to FIGS. 3A and 3B.

Software modules 104 can be used to build target IT systems with shorter development times because most of the software components of the target IT systems already exist in a predefined library. This functional reusability of software modules 104 is leveraged by the present invention to generate performance statistics that characterize each module's contribution to overall performance of a completed target IT system.

Further, system 100 includes input messages 108 that are input to reusable software modules 104 and a database 110 that includes performance statistics for individual software modules that are output from test environment computer 102. The performance statistics in database 110 include, for example, transaction or message response times, CPU levels, disk I/O utilization levels, message type, message volume, etc.

Still further, system 100 includes a performance simulation modeling tool 112 that resides on a computing system (not shown in FIG. 1; see FIG. 5), input to tool 112 that includes a repository 114 that includes a standard set of benchmarks for computer configurations and a repository 116 that includes a projected transaction mix defining workload scenarios for a target IT system, and output 118 from tool 112 that includes predicted computing resource requirements, transaction response times, input/output (I/O) activity and network message volumes.

A target IT system's design can be modeled in performance simulation modeling tool 112 using performance statistics determined in earlier tests. Tool 112 allows a system modeler to specify target hardware with which to model the target IT system. A user specifies projected message volumes and a projected transaction mix for the target IT system as input to tool 112. The output of tool 112 is a quick, cheap and highly accurate prediction of the target IT system's performance and resource utilizations. Performance simulation modeling tool 112 is, for example, a modeler in the HyPerformix IPS suite offered by HyPerformix, Inc. of Austin, Tex. The functionality of tool 112 is also discussed below relative to FIG. 4.

Set of benchmarks 114 is any set of standard computer performance rating benchmarks such as SPEC CPU2000, which is a CPU component benchmark suite provided by the Standard Performance Evaluation Corporation (SPEC).

Figure 2:
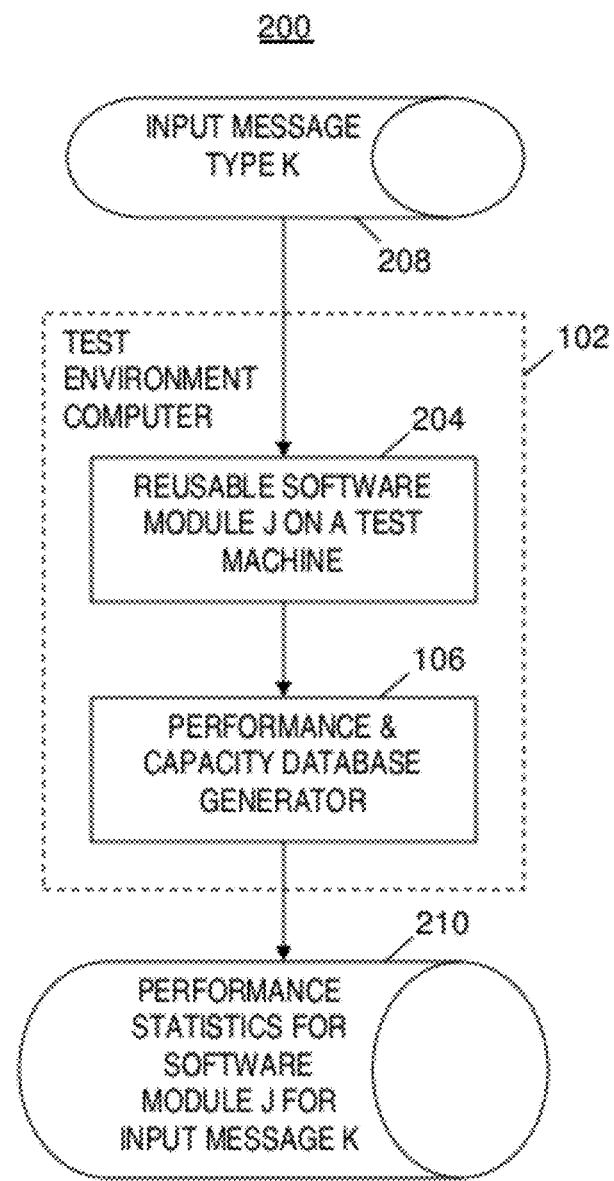
FIG. 2 is a block diagram of a system for generating the database used in the system of FIG. 1, in accordance with embodiments of the present invention.

FIG. 2 is a block diagram of a system for generating the database used in the system of FIG. 1, in accordance with embodiments of the present invention. System 200 includes test environment computer 102 that includes a reusable software module J (i.e., a software module 204) and performance & capacity database generator 106. Further, system 200 includes an input message type K (i.e., an input message type 208) that is a type of a message input to test environment computer 102. Still further, system 200 includes performance statistics 210 for software module J for input message type K. Performance statistics 210 are stored in database 110 (see FIG. 1) along with identification of which test computer configuration, software module, message type and message volume was used in the test. Thus, database 110 (see FIG. 1) is a repository of performance characteristics for each of the reusable software modules 104.

In system 200, the J is an index that denotes an individual software module of software modules 104 (see FIG. 1). Each individual software module J (i.e., software module 204) needs to be evaluated in test environment computer 102 separately. The K of input message type 208 is an index that denotes individual message types for software module J (i.e., software module 204). There may be 0 to n message types associated with a single software module J. Thus, if there are multiple message types for software module J (i.e., software module 204) then each message type K is run through software module J (i.e., software module 204) in the test environment of computer 102. The number of message types may vary for different software modules. For example, one software module may have 4 input message types, whereas another software module may have only 1 input message type.

For each combination of input message type K and software module J, an execution of the software module is performed and the performance statistics for the execution are determined, captured and stored. For example, consider a case of a library with 2 software modules. If module 1 has 6 message types and module 2 has 4 message types, then the total number of evaluations of performance statistics is 10 (i.e., 6 evaluations+4 evaluations). That is, there is one evaluation for each of the 6 message types of module 1 (i.e., 6 evaluations) and one evaluation for each of the 4 message types of module 2 (i.e., 4 evaluations).

Generating Performance & Capacity Database

Figure 3A:
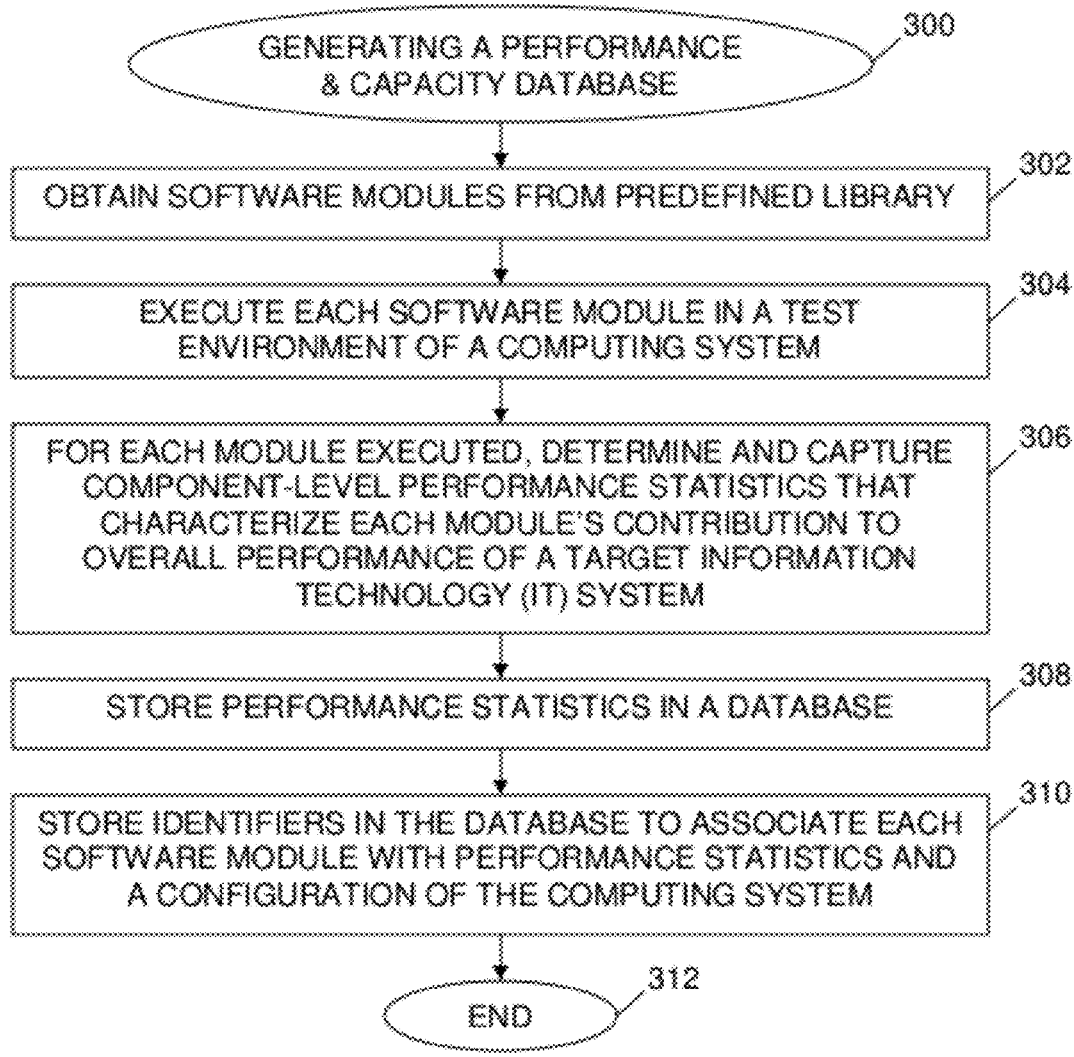
FIG. 3A is a flow diagram of a process for generating the database used in the system of FIG. 1, in accordance with embodiments of the present invention.

FIG. 3A is a flow diagram of a process for generating the performance & capacity database used in the system of FIG. 1, in accordance with embodiments of the present invention. The process of generating the performance & capacity database begins at step 300. In step 302, test environment computer 102 (see FIG. 1) obtains reusable software modules 104 (see FIG. 1) from a predefined library of reusable software modules. In step 304, the reusable software modules 104 (see FIG. 1) are run individually on test environment computer 102 (see FIG. 1).

In step 306, performance & capacity database generator 106 (see FIG. 1) determines and captures component-level performance statistics of computer 102 (see FIG. 1) for each of the individual runs of software modules 104 (see FIG. 1) in step 304. The component-level performance statistics determined and captured in step 306 characterize the contribution of each of software modules 104 (see FIG. 1) to the overall performance of a target IT system. As used herein, a target IT system is an IT system that is to be built using a set of reusable software modules, but is not yet built.

In step 308, performance & capacity database generator 106 (see FIG. 1) stores the component-level performance statistics determined in step 306 in database 110 (see FIG. 1). In step 310, performance & capacity database generator 106 (see FIG. 1) stores identifiers in database 110 (see FIG. 1) to associate each of the reusable software modules 104 (see FIG. 1) with performance statistics stored in step 308 and with a configuration of test environment computer 102 (see FIG. 1) that was used to execute the software module in step 304. An association to the configuration of computer 102 (see FIG. 1) is necessary because performance characteristics are a function of the configuration. In one embodiment, the identifiers stored in step 310 are associated with a set of performance statistics determined in step 306 and identify which software module, message type and message volume was used in the test execution of the software module in step 304. The process of generating a performance & capacity database ends at step 312.

The database generated by the process of FIG. 3A is used by a performance prediction technique such as capacity and performance simulation modeling or paper and pencil estimation to accurately predict overall IT system performance before the IT system is built. The same database (i.e., database 110 of FIG. 1) may be reused for predictions of overall performance of multiple IT systems. The prediction of overall IT system performance is described below relative to FIG. 4.

Figure 3B:
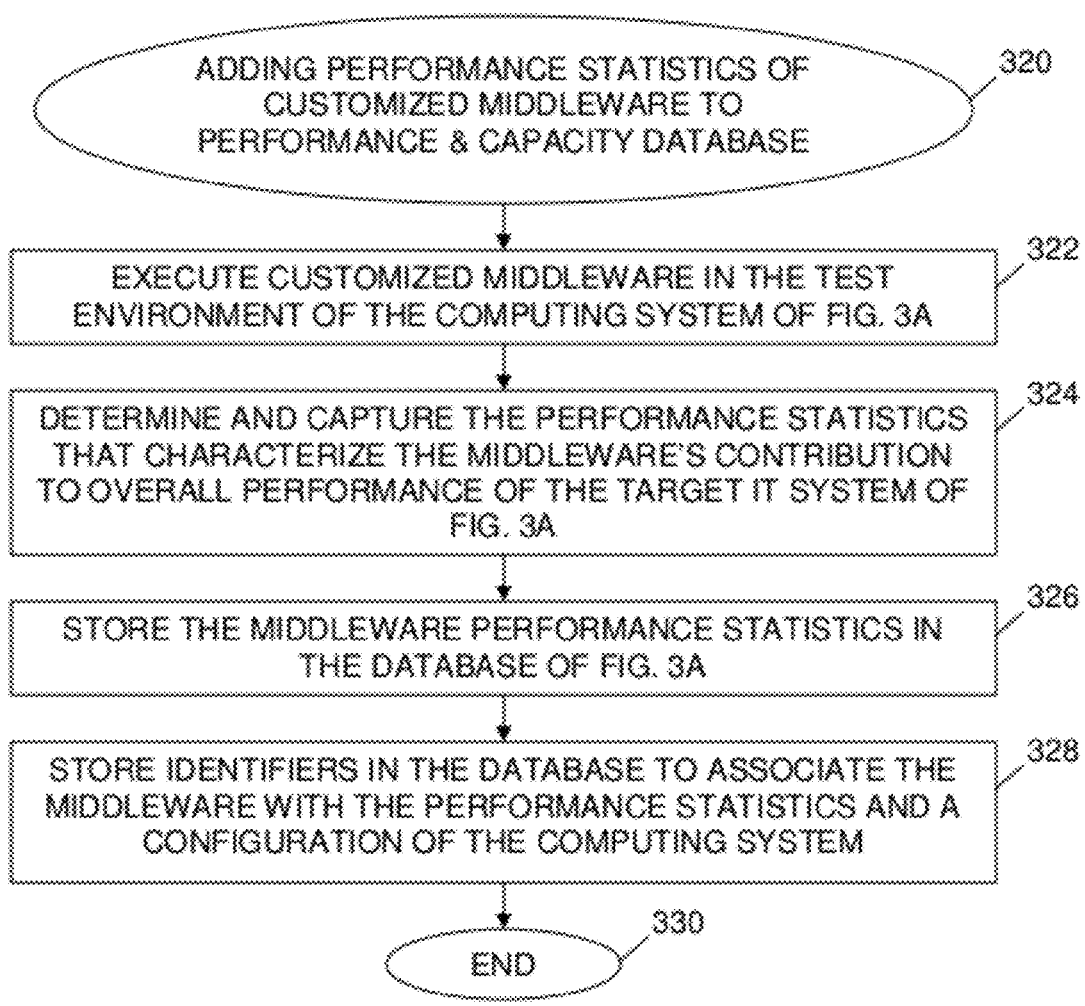
FIG. 3B is a flow diagram of a process for adding performance statistics of customized middleware to the database used in the system of FIG. 1, in accordance with embodiments of the present invention.

FIG. 3B is a flow diagram of a process for adding performance statistics of customized middleware to the database used in the system of FIG. 1, in accordance with embodiments of the present invention. The process of FIG. 3B starts at step 320 with middleware of the target IT system being customized instead of being available in a predefined library of reusable software modules 104 (see FIG. 1). In step 322, test environment computer 102 (see FIG. 1) executes the customized middleware.

In step 324, performance & capacity database generator 106 (see FIG. 1) determines and captures performance statistics that characterize the middleware's contribution to the overall performance of the target IT system.

In step 326, performance & capacity database generator 106 (see FIG. 1) stores the performance statistics determined in step 324 in database 110 (see FIG. 1). In step 328, performance & capacity database generator 106 (see FIG. 1) stores identifiers in database 110 (see FIG. 1) to associate the middleware with the performance statistics stored in step 326 and with a configuration of test environment computer 102 (see FIG. 1) that was used to execute the middleware in step 328. The process of adding performance statistics of customized middleware to a performance & capacity database ends at step 330.

After the process of FIG. 3B stores the performance statistics for the customized middleware of the target IT system in database 110 (see FIG. 1), the stored middleware performance statistics are used as needed by performance simulation modeling tool 112 (see FIG. 1). The overall performance of the target IT system is the composite of the performance statistics of the target IT system's middleware and software modules.

Predicting System Performance & Capacity

Figure 4:
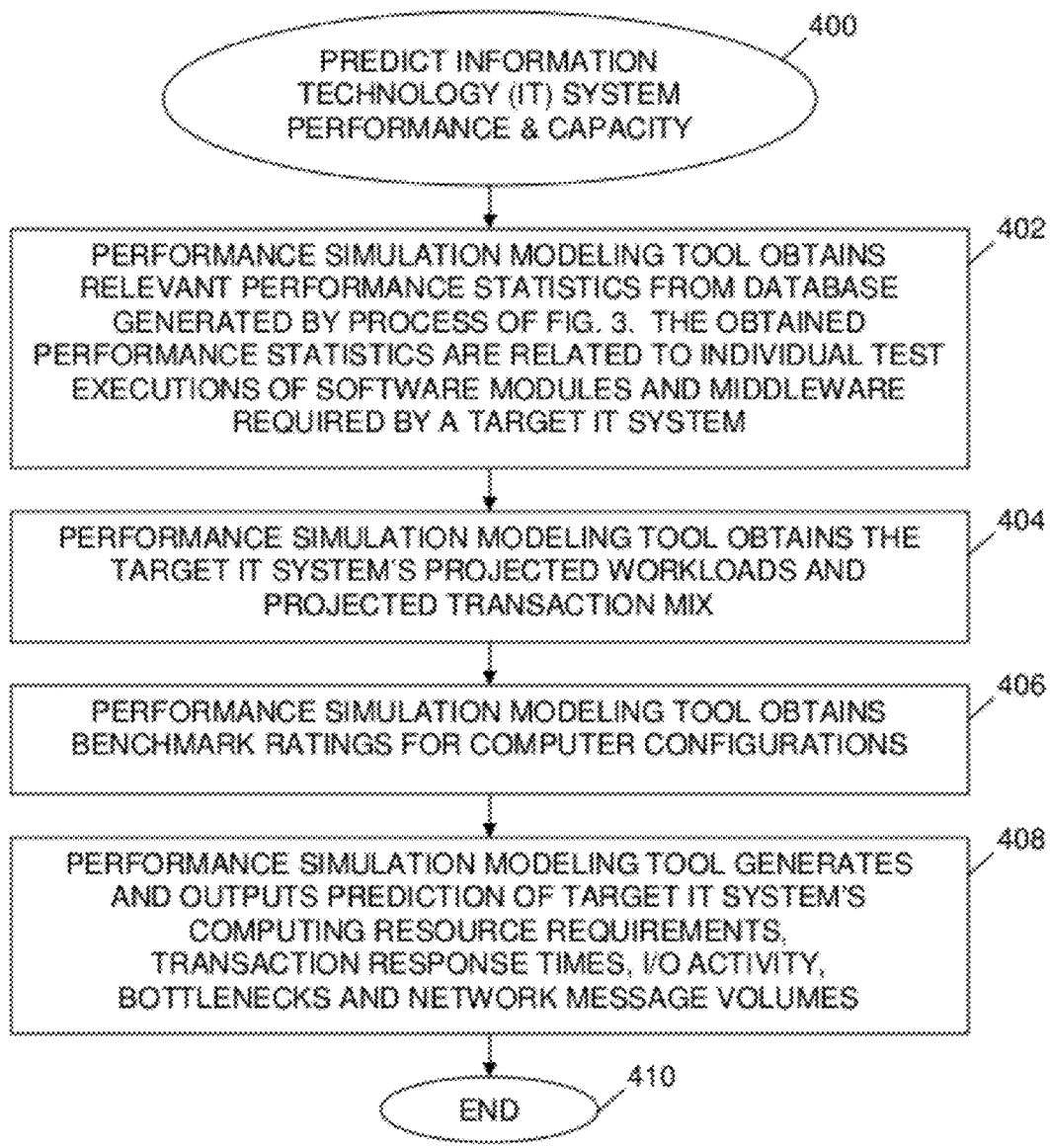
FIG. 4 is a flow diagram of a process of predicting IT system performance and capacity using the database used in the system of FIG. 1, in accordance with embodiments of the present invention.

FIG. 4 is a flow diagram of a process of predicting IT system performance and capacity using the database used in the system of FIG. 1, in accordance with embodiments of the present invention. The IT system performance and capacity prediction process begins at step 400. In step 402, performance simulation modeling tool 112 (see FIG. 1) obtains relevant performance statistics from database 110 (see FIG. 1). The relevant performance statistics obtained in step 402 are a subset of all the performance statistics included in database 110 (see FIG. 1). The relevancy of the performance statistics obtained in step 402 is based on their being associated with the execution of all software modules and middleware required to build the target IT system.

In step 404, performance simulation modeling tool 112 (see FIG. 1) obtains the target IT system's projected workloads and projected transaction mix from repository 116 (see FIG. 1). In step 406, performance simulation modeling tool 112 (see FIG. 1) obtains benchmark ratings for computer configurations from repository 114 (see FIG. 1). As one example, if tool 112 (see FIG. 1) is HyPerformix IPS, the default benchmark rating is SPECInt2000.

In step 408, performance simulation modeling tool 112 (see FIG. 1) generates and outputs a prediction of the target IT system's computing resource requirements, transaction response times, I/O activity and network message volumes. Performance simulation modeling tool 112 (see FIG. 1) generates the prediction in step 408 by utilizing the performance statistics obtained in step 402, the projected transaction mix and workloads obtained in step 404 and the benchmark ratings obtained in step 406 in one or more predefined mathematical algorithms built into tool 112 (see FIG. 1). For example, tool 112 (see FIG. 1) is HyPerformix IPS, which includes proprietary mathematical algorithms that (1) receive as input the performance statistics of step 402, the transaction mix and workloads of step 404 and the benchmark ratings of step 406 and (2) output the aforementioned prediction of step 408. The prediction outputted in step 408 is used to generate precise recommendations as to what computing resources (e.g., computer hardware, network bandwidth) are sufficient to build the target IT system while avoiding over-specifying the computing resources. The process of FIG. 4 ends at step 410.

Computing System

Figure 5:
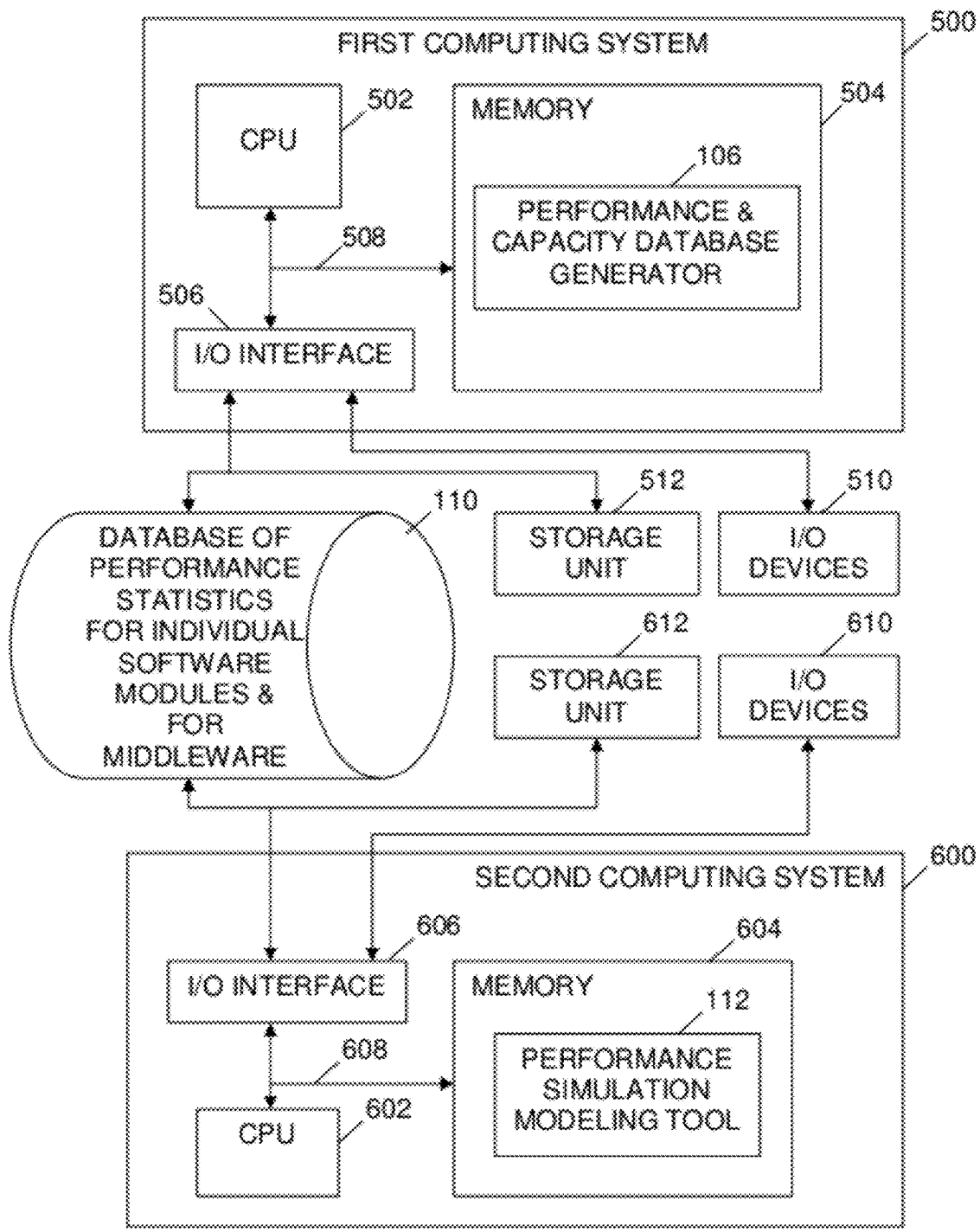
FIG. 5 is a block diagram of computing systems that include components of the system of FIG. 1 and that implement the processes of FIG. 3A, FIG. 3B and FIG. 4, in accordance with embodiments of the present invention.

FIG. 5 is a block diagram of computing systems that include components of the system of FIG. 1 and that implement the processes of FIG. 3A, FIG. 3B and FIG. 4, in accordance with embodiments of the present invention. A first computing system 500 generally comprises a central processing unit (CPU) 502, a memory 504, an input/output (I/O) interface 506, a bus 508, I/O devices 510 and a storage unit 512. CPU 502 performs computation and control functions of computing system 500. CPU 502 may comprise a single processing unit, or be distributed across one or more processing units in one or more locations (e.g., on a client and server).

Memory 504 may comprise any known type of data storage and/or transmission media, including bulk storage, magnetic media, optical media, random access memory (RAM), read-only memory (ROM), a data cache, a data object, etc. Cache memory elements of memory 504 provide temporary storage of at least some program code in order to reduce the number of times code must be retrieved from bulk storage during execution. Storage unit 512 is, for example, a magnetic disk drive or an optical disk drive that stores data. Moreover, similar to CPU 502, memory 504 may reside at a single physical location, comprising one or more types of data storage, or be distributed across a plurality of physical systems in various forms. Further, memory 504 can include data distributed across, for example, a LAN, WAN or storage area network (SAN) (not shown).

I/O interface 506 comprises any system for exchanging information to or from an external source. I/O devices 510 comprise any known type of external device, including a display monitor, keyboard, mouse, printer, speakers, handheld device, printer, facsimile, etc. Bus 508 provides a communication link between each of the components in computing system 500, and may comprise any type of transmission link, including electrical, optical, wireless, etc.

I/O interface 506 also allows computing system 500 to store and retrieve information (e.g., program instructions or data) from an auxiliary storage device (e.g., storage unit 512). The auxiliary storage device may be a non-volatile storage device (e.g., a CD-ROM drive which receives a CD-ROM disk). Computing system 500 can store and retrieve information from other auxiliary storage devices that may include database 110. Such auxiliary storage devices can include a direct access storage device (DASD) (e.g., hard disk or floppy diskette), a magneto-optical disk drive, a tape drive, or a wireless communication device. In another embodiment, database 110 is included in storage unit 512.

Memory 504 includes program code for performance & capacity database generator 106. Further, memory 504 may include other systems not shown in FIG. 5, such as an operating system (e.g., Linux) that runs on CPU 502 and provides control of various components within and/or connected to computing system 500.

A second computing system 600 generally comprises a CPU 602, a memory 604, an I/O interface 606, a bus 608, I/O devices 610 and a storage unit 612, which have the functionality, capabilities and implementation options of CPU 502, memory 504, I/O interface 506, bus 508, I/O devices 510 and storage unit 512, respectively, as described above. Computing system 600 can retrieve information from a storage device that includes database 110. In one embodiment, database 110 is included in storage unit 612. Memory 604 includes program code for performance simulation modeling tool 112.

In an alternate embodiment (not shown), computing system 500 is utilized to implement the processes of FIG. 3A, FIG. 3B and FIG. 4 without requiring computing system 600, storage unit 612, I/O devices 610 and any of the components internal to computing system 600. In this alternate embodiment, performance & capacity database generator 106 and performance simulation modeling tool 112 are both included in memory 504.

Furthermore, the invention can take the form of a computer program product accessible from a computer-usable or computer-readable medium providing program code 106 and/or program code 112 for use by or in connection with a computing system 500 and/or a computing system 600 or any instruction execution system to provide and facilitate the capabilities of the present invention. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, RAM 504, ROM, a rigid magnetic disk and an optical disk. Current examples of optical disks include compact disk-read-only memory (CD-ROM), compact disk-read/write (CD-R/W) and DVD.

Any of the components of the present invention can be deployed, managed, serviced, etc. by a service provider that offers to deploy or integrate computing infrastructure with respect to the method of predicting system performance and capacity using a database of performance statistics measured for reusable software modules. Thus, the present invention discloses a process for supporting computer infrastructure, comprising integrating, hosting, maintaining and deploying computer-readable code into a computing system (e.g., computing system 500 or computing system 600), wherein the code in combination with the computing unit is capable of performing a method of predicting system performance and capacity using a database of performance statistics measured for reusable software modules.

In another embodiment, the invention provides a business method that performs the process steps of the invention on a subscription, advertising and/or fee basis. That is, a service provider, such as a Solution Integrator, can offer to create, maintain, support, etc. a method of predicting system performance and capacity using a database of performance statistics measured for reusable software modules. In this case, the service provider can create, maintain, support, etc. a computer infrastructure that performs the process steps of the invention for one or more customers. In return, the service provider can receive payment from the customer(s) under a subscription and/or fee agreement, and/or the service provider can receive payment from the sale of advertising content to one or more third parties.

The flow diagrams depicted herein are provided by way of example. There may be variations to these diagrams or the steps (or operations) described herein without departing from the spirit of the invention. For instance, in certain cases, the steps may be performed in differing order, or steps may be added, deleted or modified. All of these variations are considered a part of the present invention as recited in the appended claims.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A computer system comprising:
a central processing unit (CPU);
a memory coupled to said CPU;
a computer-readable, tangible storage device coupled to said CPU, said storage device containing instructions that when carried out by said CPU via said memory implement a method of predicting an overall system performance and capacity of a target information technology (IT) system based on component-level performance statistics, said method comprising the steps of:
said computer system obtaining reusable software modules from a library of reusable software modules;
subsequent to said obtaining reusable software modules, said computer system performing test runs of said reusable software modules individually and performing a test run of customized middleware;
based on said performing said test runs of said reusable software modules, said computer system determining sets of component-level performance statistics measuring individual performances of said reusable software modules in said test runs;
based on said performing said test run of said customized middleware, said computer system determining middleware-based performance statistics that represent a contribution of said customized middleware to said overall system performance of said target IT system;
said computer system storing said sets of component-level performance statistics in a database that associates said sets of component-level performance statistics with said reusable software modules;
said computer system storing said middleware-based performance statistics in said database that further associates said middleware-based performance statistics with said customized middleware;

subsequent to said storing, said computer system determining said target IT system requires said reusable software modules to be components of said target IT system, wherein said target IT system is not yet built and is different from said computer system;

said computer system retrieving said sets of component-level performance statistics from said database based on said determining said target IT system requires said reusable software modules and based on said database associating said sets of component-level performance statistics with said required reusable software modules, wherein each set of component-level performance statistics characterizes a contribution of an associated reusable software module to said overall system performance of said target IT system;

said computer system retrieving said middleware-based performance statistics from said database; and subsequent to said retrieving said sets of performance statistics and said retrieving said middleware-based performance statistics and prior to said target IT system being built, said computer system generating a prediction that includes computing resource requirements of said target IT system and further includes characteristics of said overall system performance of said target IT system, wherein said characteristics of said overall system performance include a transaction response time, an input/output (I/O) activity level, and a network message volume of said target IT system, wherein a result of said generating said prediction is a generation of a recommendation of computing resources that are required to build said target IT system without over-specifying said computing resources, and wherein said generating said prediction that includes said computing resource requirements of said target IT system is based on said sets of component-level performance statistics measuring said individual performances of said reusable software modules in said test runs of said reusable software modules and is further based on said middleware-based performance statistics that represent said contribution of said customized middleware to said overall system performance of said target IT system.

2. The computer system of claim 1, wherein said method further comprises the step of storing a plurality of software module identifiers in said database, wherein a software module identifier of said plurality of software module identifiers associates a set of component-level performance statistics of said sets of component-level performance statistics and a configuration of a test computer included in said computer system with a reusable software module of said reusable software modules, and wherein said performing said test runs includes performing a test run of said reusable software module using said configuration on said test computer.

3. The computer system of claim 1, wherein said method further comprises the steps of:
said computer system receiving a projected transaction mix of said target IT system and a projected workload of said target IT system; and
said computer system receiving a plurality of benchmark ratings for configurations of a plurality of computers,
wherein said generating said prediction of said plurality of computing resources is further based on said projected transaction mix, said projected workload, and said benchmark ratings.

4. The computer system of claim 1, wherein said sets of performance statistics include a transaction response time, a CPU level, an input/output activity level, a message packet size, and a message packet rate.

5. A method of predicting an overall system performance and capacity of a target information technology (IT) system based on component-level performance statistics, said method comprising the steps of:
a computer system obtaining reusable software modules from a library of reusable software modules;
subsequent to said obtaining reusable software modules, said computer system performing test runs of said reusable software modules individually;
based on said performing said test runs of said reusable software modules, said computer system determining sets of component-level performance statistics measuring individual performances of said reusable software modules in said test runs;
said computer system storing said sets of component-level performance statistics in a database that associates said sets of component-level performance statistics with said reusable software modules;
subsequent to said storing said sets of component-level performance statistics, said computer system determining said target IT system requires said reusable software modules to be components of said target IT system, wherein said target IT system is not yet built and is different from said computer system;
said computer system retrieving said sets of component-level performance statistics from said database based on said determining said target IT system requires said reusable software modules and based on said database associating said sets of component-level performance statistics with said required reusable software modules, wherein each set of component-level performance statistics characterizes a contribution of an associated reusable software module to said overall system performance of said target IT system;
subsequent to said retrieving said sets of performance statistics and prior to said target IT system being built, said computer system generating a prediction that includes computing resource requirements of said target IT system and further includes characteristics specifying said overall system performance of said target IT system, wherein a result of said generating said prediction is a generation of a recommendation of computing resources that are required to build said target IT system without over-specifying said computing resources, and wherein said generating said prediction that includes said computing resource requirements of said target IT system is based on said sets of component-level performance statistics measuring said individual performances of said reusable software modules in said test runs of said reusable software modules;
subsequent to said obtaining reusable software modules, said computer system performing a test run of customized middleware;
based on said performing said test run of said customized middleware, said computer system determining middleware-based performance statistics that represent a contribution of said customized middleware to said overall system performance of said target IT system;
said computer system storing said middleware-based performance statistics in said database that further associates said middleware-based performance statistics with said customized middleware; and said computer system retrieving said middleware-based performance statistics from said database, wherein said step of said computer system generating said prediction that includes computing resource requirements of said target IT system and further includes characteristics of said overall system performance of said target IT system is performed subsequent to said retrieving said middleware-based performance statistics, and is further based on said middleware-based performance statistics that represent said contribution of said customized middleware to said overall system performance of said target IT system.

6. The method of claim 5, wherein said step of generating said prediction that further includes characteristics specifying said overall system performance of said target IT system includes generating said prediction that further includes said characteristics that include a transaction response time, an input/output (I/O) activity level, and a network message volume of said target IT system.

7. The method of claim 5, further comprising storing a plurality of software module identifiers in said database, wherein a software module identifier of said plurality of software module identifiers associates a set of component-level performance statistics of said sets of component-level performance statistics and a configuration of a test computer included in said computer system with a reusable software module of said reusable software modules, and wherein said performing said test runs includes performing a test run of said reusable software module using said configuration on said test computer.

8. The method of claim 5, further comprising the steps of:
said computer system receiving a projected transaction mix of said target IT system and a projected workload of said target IT system; and
said computer system receiving a plurality of benchmark ratings for configurations of a plurality of computers,
wherein said generating said prediction of said plurality of computing resources is further based on said projected transaction mix, said projected workload, and said benchmark ratings.

9. The method of claim 5, wherein said sets of performance statistics include a transaction response time, a CPU level, an input/output activity level, a message packet size, and a message packet rate.

10. A computer program product, comprising
a computer-readable, tangible storage device; and
a computer-readable program code stored on said computer-readable, tangible storage device, said computer-readable program code containing instructions that are carried out by a processor of a computer system to implement a method for predicting an overall system performance and capacity of a target information technology (IT) system based on component-level performance statistics, said method comprising the steps of:
said computer system obtaining reusable software modules from a library of reusable software modules;
subsequent to said obtaining reusable software modules, said computer system performing test runs of said reusable software modules individually;
based on said performing said test runs of said reusable software modules, said computer system determining sets of component-level performance statistics measuring individual performances of said reusable software modules in said test runs;
said computer system storing said sets of component-level performance statistics in a database that associates said sets of component-level performance statistics with said reusable software modules;
subsequent to said storing said sets of component-level performance statistics, said computer system determining said target IT system requires said reusable software modules to be components of said target IT system, wherein said target IT system is not yet built and is different from said computer system;
said computer system retrieving said sets of component-level performance statistics from said database based on said determining said target IT system requires said reusable software modules and based on said database associating said sets of component-level performance statistics with said required reusable software modules, wherein each set of component-level performance statistics characterizes a contribution of an associated reusable software module to said overall system performance of said target IT system;
subsequent to said retrieving said sets of performance statistics and prior to said target IT system being built, said computer system generating a prediction that includes computing resource requirements of said target IT system and further includes characteristics specifying said overall system performance of said target IT system, wherein a result of said generating said prediction is a generation of a recommendation of computing resources that are required to build said target IT system without over-specifying said computing resources, and wherein said generating said prediction that includes said computing resource requirements of said target IT system is based on said sets of component-level performance statistics measuring said individual performances of said reusable software modules in said test runs of said reusable software modules;
subsequent to said obtaining reusable software modules, said computer system performing a test run of customized middleware;
based on said performing said test run of said customized middleware, said computer system determining middleware-based performance statistics that represent a contribution of said customized middleware to said overall system performance of said target IT system;
said computer system storing said middleware-based performance statistics in said database that further associates said middleware-based performance statistics with said customized middleware; and
said computer system retrieving said middleware-based performance statistics from said database,
wherein said step of said computer system generating said prediction that includes computing resource requirements of said target IT system and further includes characteristics of said overall system performance of said target IT system is performed subsequent to said retrieving said middleware-based performance statistics, and is further based on said middleware-based performance statistics that represent said contribution of said customized middleware to said overall system performance of said target IT system.

11. The program product of claim 10, wherein said step of generating said prediction that further includes characteristics specifying said overall system performance of said target IT system includes generating said prediction that further includes said characteristics that include a transaction response time, an input/output (I/O) activity level, and a network message volume of said target IT system.

12. The program product of claim 10, wherein said method further comprises the step of storing a plurality of software module identifiers in said database, wherein a software module identifier of said plurality of software module identifiers associates a set of component-level performance statistics of said sets of component-level performance statistics and a configuration of a test computer included in said computer system with a reusable software module of said reusable software modules, and wherein said performing said test runs includes performing a test run of said reusable software module using said configuration on said test computer.

13. The program product of claim 10, wherein said method further comprises the steps of:
said computer system receiving a projected transaction mix of said target IT system and a projected workload of said target IT system; and
said computer system receiving a plurality of benchmark ratings for configurations of a plurality of computers,
wherein said generating said prediction of said plurality of computing resources is further based on said projected transaction mix, said projected workload, and said benchmark ratings.

14. The program product of claim 10, wherein said sets of performance statistics include a transaction response time, a CPU level, an input/output activity level, a message packet size, and a message packet rate.

15. A process for supporting computing infrastructure, said process comprising providing at least one support service for at least one of creating, integrating, hosting, maintaining, and deploying computer-readable code in a computer system comprising a processor, wherein said processor carries out instructions contained in said code causing said computer system to perform a method of predicting an overall system performance and capacity of a target information technology (IT) system based on component-level performance statistics, wherein said method comprises the steps of:
said computer system obtaining reusable software modules from a library of reusable software modules;
subsequent to said obtaining reusable software modules, said computer system performing test runs of said reusable software modules individually;
based on said performing said test runs of said reusable software modules, said computer system determining sets of component-level performance statistics measuring individual performances of said reusable software modules in said test runs;
said computer system storing said sets of component-level performance statistics in a database that associates said sets of component-level performance statistics with said reusable software modules;
subsequent to said storing said sets of component-level performance statistics, said computer system determining said target IT system requires said reusable software modules to be components of said target IT system, wherein said target IT system is not yet built and is different from said computer system;
said computer system retrieving said sets of component-level performance statistics from said database based on said determining said target IT system requires said reusable software modules and based on said database associating said sets of component-level performance statistics with said required reusable software modules, wherein each set of component-level performance statistics characterizes a contribution of an associated reusable software module to said overall system performance of said target IT system;
subsequent to said retrieving said sets of performance statistics and prior to said target IT system being built, said computer system generating a prediction that includes computing resource requirements of said target IT system and further includes characteristics specifying said overall system performance of said target IT system, wherein a result of said generating said prediction is a generation of a recommendation of computing resources that are required to build said target IT system without over-specifying said computing resources, and wherein said generating said prediction that includes said computing resource requirements of said target IT system is based on said sets of component-level performance statistics measuring said individual performances of said reusable software modules in said test runs of said reusable software modules;
subsequent to said obtaining reusable software modules, said computer system performing a test run of customized middleware;
based on said performing said test run of said customized middleware, said computer system determining middleware-based performance statistics that represent a contribution of said customized middleware to said overall system performance of said target IT system;
said computer system storing said middleware-based performance statistics in said database that further associates said middleware-based performance statistics with said customized middleware; and
said computer system retrieving said middleware-based performance statistics from said database,
wherein said step of said computer system generating said prediction that includes computing resource requirements of said target IT system and further includes characteristics of said overall system performance of said target IT system is performed subsequent to said retrieving said middleware-based performance statistics, and is further based on said middleware-based performance statistics that represent said contribution of said customized middleware to said overall system performance of said target IT system.

16. The process of claim 15, wherein said step of generating said prediction that further includes characteristics specifying said overall system performance of said target IT system includes generating said prediction that further includes said characteristics that include a transaction response time, an input/output (I/O) activity level, and a network message volume of said target IT system.

17. The process of claim 15, wherein said method further comprises the step of storing a plurality of software module identifiers in said database, wherein a software module identifier of said plurality of software module identifiers associates a set of component-level performance statistics of said sets of component-level performance statistics and a configuration of a test computer included in said computer system with a reusable software module of said reusable software modules, and wherein said step of performing said test runs includes performing a test run of said reusable software module using said configuration on said test computer.

* * * * *